United States Patent [19]

Boudewijns

[11] Patent Number: 4,893,096
[45] Date of Patent: Jan. 9, 1990

[54] OSCILLATOR CIRCUIT COMPRISING AN OSCILLATOR WITH A CMOS

[75] Inventor: Arnoldus J. J. Boudewijns, Eindhoven, Netherlands

[73] Assignee: U.S. Philips Corporation, New York, N.Y.

[21] Appl. No.: 203,048

[22] Filed: Jun. 2, 1988

[30] Foreign Application Priority Data

Jun. 5, 1987 [NL] Netherlands .................... 8701316

[51] Int. Cl.[4] .................................. H03L 1/00
[52] U.S. Cl. ................................ 331/175; 331/57; 307/310
[58] Field of Search ............. 331/57, 175, 176, 177 R; 307/297, 310

[56] References Cited

U.S. PATENT DOCUMENTS 4,414,515 11/1983 Suzuki et al. .................. 331/179 X
4,473,762 9/1984 Iwahashi et al. .............. 307/310 X

OTHER PUBLICATIONS

Carr, How to Design Oscillator Circuits, Radio-Electronics, 58(1), Jan. 1987, p. 65.

Primary Examiner—Eugene R. Laroche
Assistant Examiner—Robert J. Pascal
Attorney, Agent, or Firm—Bernard Franzblau

[57] ABSTRACT

An oscillator circuit comprising an oscillator with a CMOS gate. A suitably proportioned CMOS gate consumes power only when its gate output, assumed to be capacitively loaded, is charged. Therefore, a relation can be deduced between an oscillation frequency of the oscillator and a ratio of the voltage across the CMOS gate and the conducted current. The actual oscillator is included in a circuit so that this ratio remains substantially constant and becomes substantially independent of temperature variations. To achieve this, the oscillator is included in a first current branch having a first current source. A second current branch comprising a second current source in series with a resistance is arranged parallel to the first current branch. The current sources supply currents in a fixed ratio. The current branches are coupled to one another by means of control means for controlling the current sources so that the ratio of a voltage across the CMOS gate and a voltage across the resistance is constant.

19 Claims, 2 Drawing Sheets

OSCILLATOR CIRCUIT COMPRISING AN OSCILLATOR WITH A CMOS

BACKGROUND OF THE INVENTION

This invention relates to an oscillator circuit comprising an oscillator with a CMOS gate. Oscillator circuits of this kind are known from Radio-Electronics, 58(1), January 1987, page 65. As is shown, a suitably proportioned CMOS gate consumes power only if a quantity of charge Q is transferred from a first supply terminal, through a PMOS transistor, to a gate output which is loaded by a capacitance C. If this takes place at a frequency f, the CMOS gate consumes a current I equal to $I = f \cdot Q$. Because the gate output of a CMOS gate is fully charged or discharged to the applied supply voltage levels wherebetween a potential V prevails, the current consumed is $I = f \cdot C \cdot V$.

In the known oscillator circuits the frequency varies in dependence on, for example, the temperature because the characteristics of CMOS transistors are temperature-dependent.

SUMMARY OF THE INVENTION

It is an object of the invention to provide an oscillator circuit which comprises an oscillator which includes a CMOS gate and which oscillates with a stable frequency. To achieve this, an oscillator circuit in accordance with the invention is characterized in that it comprises frequency stabilization means which keep a ratio of a current consumed by the CMOS gate and a voltage present across the CMOS gate substantially constant. From the expressions for the consumed current it follows that the frequency f is substantially constant if the ratio I/V is kept constant. The capacitance C is a constant.

An embodiment of an oscillator circuit in accordance with the invention is characterized in that the frequency stabilization means comprise a first current branch and a second current branch which are connected to a first supply terminal and which comprise a first and a second controllable current source, respectively, for powering the CMOS gate, which is connected to a second supply terminal, and a linear resistance element which is connected to the second supply terminal, respectively, the ratio of the currents supplied by the current sources being substantially constant. Control means are connected between the CMOS gate and the resistance element on the one side and the current sources on the other side. The control means control the current sources so that the ratio of the voltage across the CMOS gate and a voltage present across the resistance element is constant. By fixing the ratio of the currents and by keeping the voltage present across the resistance element equal to the voltage present across the CMOS gate, the ratio I/V is fixed. The resistance element is preferably of a type having a substantially temperature-independent resistance value in the relevant temperature range (for example, from $-40°$ C. to $+120°$ C.).

A further embodiment of an oscillator circuit in accordance with the invention is characterized in that the first and the second current source each comprise a respective transistor, a respective main current path of which is connected between the first supply terminal and the CMOS gate and between the first supply terminal and the resistance element, respectively. The control means comprises an operational amplifier having an output which is connected to control electrodes of the transistors, an inverting input thereof being connected between the first current source and the CMOS gate while a noninverting input thereof is connected between the second current source and the resistance element. As is known, a feedback operational amplifier controls its input voltages so that they remain equal.

A further embodiment of an oscillator circuit in accordance with the invention is characterized in that the current sources together comprise a current mirror having a first and a second transistor of a first conductivity type, a respective main current path thereof being included in the first and the second current branch, respectively. The control means comprise a third transistor of a second conductivity type, a main current path of which is included in the second current branch between the resistance element and the second transistor. The first current branch also includes a main current path of a fourth transistor of the second conductivity type connected between the first transistor and the CMOS gate. Control electrodes of the first and the second transistor are connected to one another and to a junction of the second and the third transistor. Control electrodes of the third and the fourth transistor are connected to one another and to a junction of the first and the fourth transistor. A voltage variation across the CMOS gate thus results in a current variation through the third transistor, which current variation is fed back to the current mirror as a control voltage variation. The fourth transistor then acts as a voltage level shifter for an amount of one threshold voltage. This is a simple method of realizing the frequency stabilization means.

A further embodiment of an oscillator circuit in accordance with the invention is characterized in that the first, the second, the third and the fourth transistor are of a bipolar type. Because the current control voltage characteristic of a bipolar transistor is steeper than that of a MOS transistor, a finer adjustment is obtained than if the first to the fourth transistor were of the field-effect type. Moreover, field-effect transistors are more susceptible to 1/f noise than bipolar transistors, so that in the case of frequency stabilization means realized by means of bipolar transistors the effect of 1/f noise on the oscillator is less than in the case of frequency stabilization means realized by means of field-effect transistors.

A further embodiment of an oscillator circuit in accordance with the invention is characterized in that the bases of the first and the second transistor are connected to the junction of the second and the third transistor, via a base-emitter path of a fifth transistor of the first conductivity type, a collector terminal of which is connected to the second supply terminal. The fifth transistor drains the base currents of the first and the second transistor because these base currents would otherwise disturb the ratio of the currents in the first and the second current branch, notably if the first and the second transistor have a low current gain factor, such as in pnp transistors. The draining of the base currents reduces the effect of the temperature-dependent current gain factor on the ratio of the currents in the first and the second current branch. The improved current ratio becomes manifest as a more stable frequency.

A further embodiment of an oscillator circuit in accordance with the invention is characterized in that the supply terminals of a second CMOS gate, having substantially the same d.c. behaviour as the CMOS gate, referred to hereinafter as the first CMOS gate, are connected across the resistance element in order to compensate for leakage currents in the first CMOS gate, an input terminal of the second CMOS gate being connected to an input terminal of the first CMOS gate. The second CMOS gate compensates for leakage currents in the second current branch which occur when the first CMOS gate in the oscillator is switched. Preferably, the output of the second CMOS gate carries a capacitive load which is egligibly small with respect to the capacitive load of the first CMOS gate. Thus, it is avoided that, in addition to the leakage current due to the d.c. behaviour of the second CMOS gate, the charging current for the capacitive load at the output of the second CMOS gate also has an effect on the adjustment.

A further embodiment of an oscillator in accordance with the invention is characterized in that the resistance is adjustable. Then, the frequency is adjusted by adjustment of the resistance.

BRIEF DESCRIPTION OF THE DRAWINGS

The invention will be described in detail hereinafter with reference to the accompanying drawing; in which.

DESCRIPTION OF THE PREFERRED EMBODIMENTS

Figure 1:
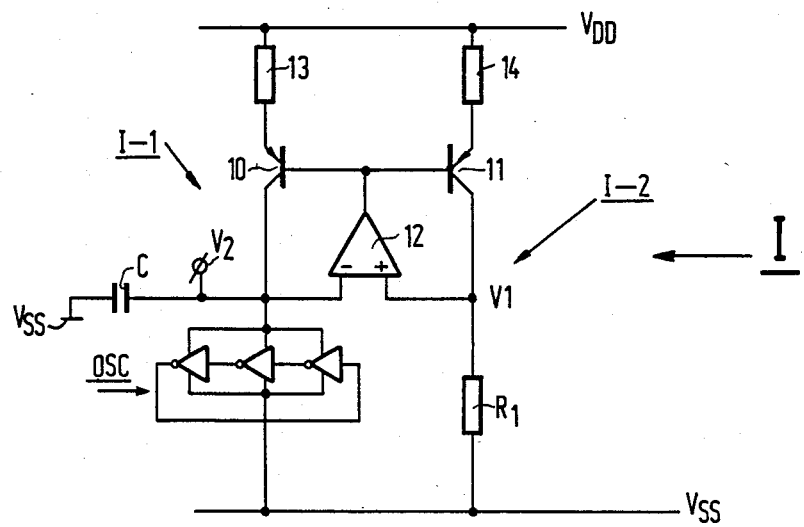
FIG. 1 shows a first embodiment of an oscillator circuit in accordance with the invention.

FIG. 1 shows an oscillator circuit I in which the CMOS oscillator OSC is connected in series with a main current path of a transistor 10 between supply terminals $V_{DD}$ and $V_{SS}$, thus forming a first current branch I-1. A second current branch I-2 comprises a main current path of a transistor 11 in series with a resistance $R_1$. The control means are formed by an operational amplifier 12. The output of the amplifier 12 is connected to the control electrodes of the transistors 10 and 11 which form controlled current sources. The non-inverting input of the amplifier 12 is connected to the junction of the transistor 11 and the resistance $R_1$, and its inverting input is connected to the junction of the oscillator OSC and the transistor 10. For the sake of simplicity it is assumed that the transistors 10 and 11 are identical, like the current adjustment resistance 13 and 14. Because a feedback operational amplifier 12 keeps the difference between its input voltages $V_1$ and $V_2$ equal to zero and because the currents in the two branches I-1 and I-2 are equal, it is achieved that the ratio of the voltage across and the current through the CMOS oscillator OSC is equal to the value of the resistance $R_1$. The capacitor C serves for smoothing ripples in the supply voltage $V_2$ for the oscillator. These ripples are caused by the intermittent drawing of current by the oscillator OSC.

Figure 2:
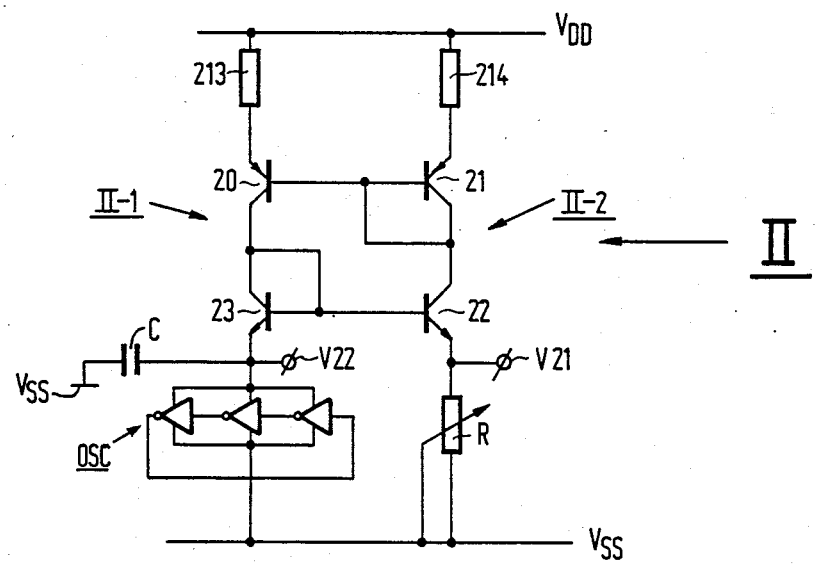
FIG. 2 shows a second embodiment of an oscillator circuit in accordance with the invention.

FIG. 2 shows an oscillator circuit II in which the CMOS oscillator OSC is connected between two supply terminals $V_{DD}$ and $V_{SS}$ in series with main current paths of transistors 20 and 23, thus forming a first current branch II-1. A second current branch II-2 is formed by the series connection of the main current paths of transistors 21 and 22 and resistance R between $V_{DD}$ and $V_{SS}$. The transistors 20 and 21 form a first and a second current source in a current mirror arrangement. The control means comprise the transistor 22. The transistor 23 is connected as a diode and serves as a level shifter. For the sake of simplicity it is assumed that the transistors 20 and 21 are of the same size, like the transistors 22 and 23. In the case of equilibrium, no charge accumulation will occur anywhere and both current branches II-1 and II-2 will conduct substantially the same current. Because the transistors 22 and 23 conduit substantially the same current with an approximately equal control voltage, their respective emitter voltages $V_{21}$ and $V_{22}$ are substantially identical. The ratio of $V_{22}$ and the current conducted by the oscillator OSC then equals the value of the resistance R. When the current consumed by the oscillator OSC decreases due to a temperature variation, in the first instance charge will be accumulated on the terminal $V_{22}$, with the result that the emitter voltage of the transistor 23 increases. This results in pinching of the transistor 23 so that the current from the transistor 20 causes an accumulation of charge on the control electrodes of the transistors 22 and 23. As a result, the control voltage for the transistor 22 as well as the transistor 23 increases. Consequently, the transistor 23 will draw more current, resulting in an increased control voltage for the transistors 20 and 21. The transistors 20 and 21 are then turned on further. The current adjustment will continue to change until charge accumulation no longer occurs anywhere. The ratio of $V_{22}$ and the current consumed by the oscillator OSC is then identical again to the value of the resistance R. Because this ratio occurs in the previously described expression for the oscillation frequency f, the oscillation frequency is now a function of the value of the resistance R. By variation of R, represented in FIG. 2 by a variable resistance, the frequency is also varied. If desired, the current adjustment resistances 213 and 214 can be included, and also a capacitor C for smoothing ripples in $V_{22}$.

Figure 3:
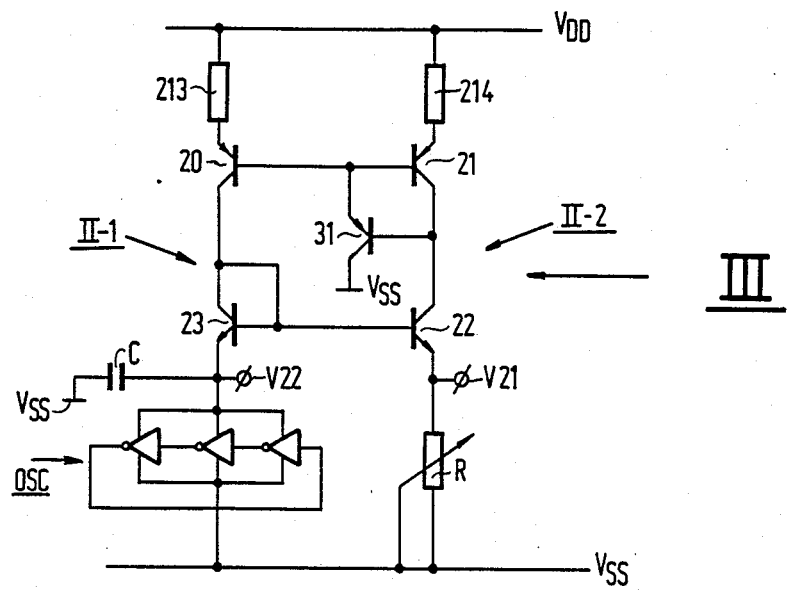
FIG. 3 shows an extension of the oscillator circuit shown in FIG. 2.

FIG. 3 shows a further embodiment of an oscillator circuit III in accordance with the invention. Because this embodiment is an elaboration of the circuit II of FIG. 2, corresponding components are denoted by corresponding reference numerals. In comparison with the circuit shown in FIG. 2, a transistor 31 has been added. This transistor substantially drains the base currents of the transistors 20 and 21. Because the current gain factor is small for pnp transistors, the base currents of the transistors 20 and 21 in FIG. 2 might cause an undesirably great unbalance in the currents of the first and the second current branch. The second current branch would have to drain the base currents of the transistors 20 and 21 to $V_{SS}$. The ratio of the currents in the current branches then becomes a function of the current gain factor of the pnp transistors 20 and 21, and hence is also temperature-dependent. The transistor 31 drains the base currents of the transistors 20 and 21 and eliminates this problem. A similar arrangement with an additional transistor for the transistor pair 22/23 is feasible, but generally not necessary because the current gain factor of a npn transistor is greater than that of a pnp transistor.

Figure 4:
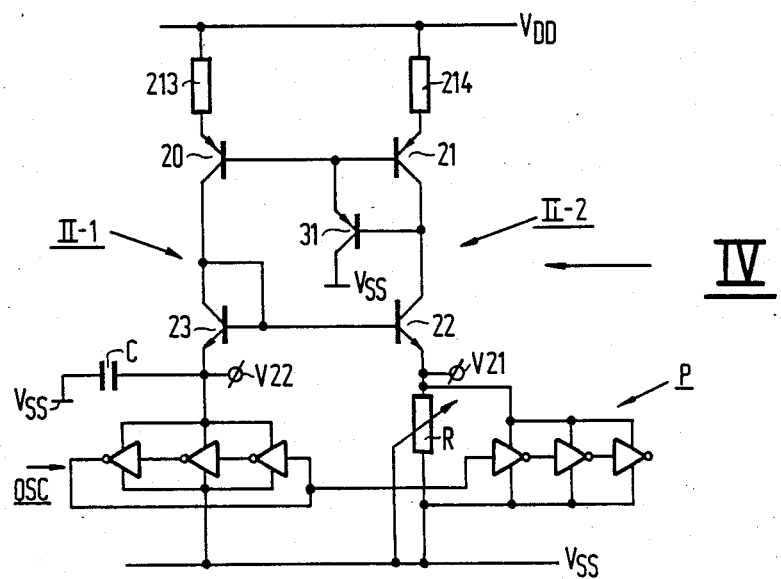
FIG. 4 shows a further extension of the oscillator circuit shown in FIG. 3.

FIG. 4 shows an embodiment of an oscillator circuit IV in accordance with the invention which is an elaboration of the circuit shown in FIG. 3. Corresponding components are denoted by corresponding reference numerals. Unlike the circuit shown in FIG. 3, the circuit shown in FIG. 4 comprises a sub-circuit P which is connected parallel to the resistance R. The sub-circuit P comprises substantially the same CMOS gates as the oscillator OSC and switches in synchronism with the oscillator OSC. When a CMOS gate is switched, a leakage current will briefly appear. The magnitude of this leakage current is related to the temperature-dependent threshold voltages of the various transistors in the CMOS gate. Thus, the current consumed by the oscillator OSC contains a first contribution in the form of a charge current for the capacitances on the outputs of the CMOS gates and a second contribution in the form of a leakage current occurring when a CMOS gate is switched. The second contribution is generally small in comparison with the first contribution. The ratio of the first current contribution and the voltage across the oscillator OSC determines the frequency. In order to fix this ratio by means of the resistance R and to ensure that it is not disturbed by the leakage currents in the oscillator OSC, the sub-circuit is connected parallel to the resistance R in the second current branch. In that case only the charge current will flow through the resistance R. The leakage current will flow through the sub-circuit P. Thus, the frequency is compensated for temperature-dependent variations of the threshold voltages.

What is claimed is:

1. An oscillator circuit, comprising an oscillator with a CMOS gate, characterized in that the oscillator comprises frequency stabilization means coupled to said oscillator so as to keep a ratio of a current consumed by the CMOS gate and a supply voltage present across the CMOS gate substantially constant.

2. An oscillator circuit as claimed in claim 1, wherein the frequency stabilization means comprise a controllable power supply circuit for powering the CMOS gate, a reference circuit which includes a substantially temperature-independent linear resistance element across which a reference voltage is developed and through which a reference current flows, and a control circuit having a first and a second measuring input connected to an output of the controllable power supply circuit and to the reference circuit, respectively, for the measurement of either a voltage present across the CMOS gate or a current applied to the CMOS gate, and for the measurement of either the reference voltage or the reference current, respectively, in order to control the controllable power supply circuit in dependence on a ratio of the measured quantities, whereby the frequency stabilization means fixes said ratio of current and voltage.

3. An oscillator circuit as claimed in claim 1, wherein the frequency stabilization means comprise a first current branch and a second current branch connected to a first supply terminal and which comprise a first and a second controllable current source, respectively, for powering the CMOS gate and a linear resistance element, respectively, and each of which is connected to the second supply terminal, the ratio of the currents supplied by the current sources being substantially constant, and control means having input means connected to the CMOS gate and to the resistance element and having an output coupled to the current sources, said control means controlling the current sources so that the ratio of the voltage across the CMOS gate and a voltage present across the resistance element is constant.

4. An oscillator circuit as claimed in claim 3, wherein the first and the second current source comprise a respective first and second transistor, respective main current paths of which are connected between the first supply terminal and the CMOS gate and between the first supply terminal and the resistance element, respectively, the control means comprising an operational amplifier having an output connected to control electrodes of the transistors, an inverting input thereof being connected between the first current source and the CMOS gate and a non-inverting input thereof being connected between the second current source and the resistance element.

5. An oscillator circuit as claimed in claim 3, wherein the current sources together comprise a current mirror having a first and a second transistor of a first conductivity type, a respective main current path thereof being included in the first and the second current branch, respectively, the control means comprising a third transistor of a second conductivity type, a main current path of which is included in the second current branch between the resistance element and the second transistor, the first current branch including a main current path of a fourth transistor of the second conductivity type included between the first transistor and the CMOS gate, control electrodes of the first and the second transistor being connected to one another and to a junction of the second and the third transistor, control electrodes of the third and fourth transistor being connected to one another and to a junction of the first and the fourth transistor.

6. An oscillator circuit as claimed in claim 5, wherein the first, the second, the third and the fourth transistor are of a bipolar type.

7. An oscillator circuit as claimed in claim 6, wherein said control electrodes of the first and the second transistor are connected to the junction of the second and the third transistor via a base-emitter path of a fifth transistor of the first conductivity type, a collector terminal of the fifth transistor being connected to the second supply terminal.

8. An oscillator circuit as claimed in claim 7, wherein said control electrodes of the third and the fourth transistor are connected to the junction of the first and the fourth transistor via a base-emitter path of a sixth transistor of the second conductivity type and having a collector terminal connected to the first supply terminal.

9. An oscillator circuit as claimed in claim 2, characterized in that supply terminals of a second CMOS gate, having substantially the same d.c. behavior as the first CMOS gate, are connected across the resistance element in order to compensate for leakage currents in the first CMOS gate, an input terminal of the second CMOS gate being connected to an input terminal of the first CMOS gate.

10. An oscillator circuit as claimed in claim 2 wherein the resistance element is adjustable.

11. An oscillator circuit as claimed in claim 2 further comprising a capacitance connected in parallel with the CMOS gate.

12. A oscillator circuit as claimed in claim 6, wherein said control electrodes of the third and the fourth transistor are connected to the junction of the first and the fourth transistor via a base-emitter path of fifth transistor of the second conductivity type and having a collector terminal connected to the first supply terminal.

13. An oscillator circuit as claimed in claim 1, wherein said frequency stabilization means comprises a temperature independent reference element and control means coupled to said CMOS gate and to said reference element and responsive to said CMOS gate current for keeping said ratio of CMOS gate current to CMOS gate voltage equal to the value of said reference element and thereby substantially constant.

14. An oscillator circuit as claimed in claim 13, wherein said control means comprises first and second matched bipolar transistors.

15. An oscillator circuit comprising:
   first and second circuit branches connected in parallel across first and second supply voltage terminals,
   said first circuit branch comprising a first series circuit including a first transistor and an oscillator with a CMOS gate,
   said second circuit branch comprising a second series circuit including a second transistor and a temperature independent reference element, and
   control means coupled to said first and second circuit branches for controlling said first and second transistors so as to maintain substantially constant the ratio of CMOS gate current to CMOS gate voltage.

16. An oscillator circuit as claimed in claim 15, wherein said first and second transistors are connected to function as first and second controllable current sources providing a substantially constant ratio of first and second currents and said control means control said first and second current sources so that the ratio of the voltage across the CMOS gate and a voltage produced across the reference element is constant.

17. An oscillator circuit as claimed in claim 15, wherein said control means comprise an operational amplifier having first and second inputs coupled to a junction of said first transistor and said CMOS gate and to a junction of said second transistor and said reference element, respectively, and an output coupled to control electrodes of said first and second transistors.

18. An oscillator circuit as claimed in claim 15, wherein said first and said second transistors are of a first conductivity type and are connected to form a current mirror, and
   said control means comprise third and fourth transistors of a second conductivity type respectively connected in series circuit in the second and first circuit branches between the second transistor and the reference element and between the first transistor and the CMOS gate, respectively, and with control electrodes of the first and second transistors connected in common to a junction of the second and third transistors and control electrodes of the third and fourth transistors connected in common to a junction of the first and fourth transistors.

19. An oscillator circuit as claimed in claim 15, wherein said first and second transistors are connected to form a current mirror and thereby function as first and second controllable current sources providing a substantially constant ratio of first and second currents.

* * * * *